US005793001A

United States Patent [19]

Ferralli

[11] Patent Number: 5,793,001

[45] Date of Patent: Aug. 11, 1998

[54] SYNCHRONIZED MULTIPLE TRANSDUCER SYSTEM

[75] Inventor: Michael W. Ferralli, Fairview, Pa.

[73] Assignee: Technology Licensing Company, Pittsburgh, Pa.

[21] Appl. No.: 587,225

[22] Filed: Jan. 16, 1996

[51] Int. Cl.[6] .......... H05K 5/00

[52] U.S. Cl. .......... 181/155; 181/175

[58] Field of Search .......... 181/155, 175, 181/176, 144, 146, 199, 30; 381/158, 160; 357/151

[56] References Cited

U.S. PATENT DOCUMENTS

| | | | |
|---|---|---|---|
| 1,716,199 | 6/1929 | Von Hofe et al. . | |
| 2,064,911 | 12/1936 | Hayes . | |
| 3,007,133 | 10/1961 | Padberg, Jr. . | |
| 3,819,005 | 6/1974 | Westlund . | |
| 3,819,006 | 6/1974 | Westlund . | |
| 3,908,095 | 9/1975 | Jinsenji . | |
| 4,348,750 | 9/1982 | Schwind . | |
| 4,421,200 | 12/1983 | Ferralli et al. . | |
| 4,474,258 | 10/1984 | Westlund . | |
| 4,588,042 | 5/1986 | Palet et al. . | |
| 4,629,030 | 12/1986 | Ferralli . | |
| 4,836,328 | 6/1989 | Ferralli . | |
| 4,844,198 | 7/1989 | Ferralli . | |
| 4,907,671 | 3/1990 | Wiley . | |
| 5,258,538 | 11/1993 | Queen . | |
| 5,268,539 | 12/1993 | Ono | 181/155 |
| 5,306,880 | 4/1994 | Coziar et al. . | |
| 5,402,502 | 3/1995 | Boothroyd et al. . | |
| 5,418,336 | 5/1995 | Negishi et al. . | |
| 5,612,176 | 3/1997 | LaCarrubba | 367/151 |
| 5,616,892 | 4/1997 | Ferralli | 181/155 |

*Primary Examiner*—Khanh Dang

[57] ABSTRACT

In general, the invention comprises a device capable of emitting either acoustic or electromagnetic radiant energy. The device has at least one reflector with a smooth concave surface which reflects the energy emitted from the transducing element. The device also has at least two transducing elements for producing this energy. The shape of this reflector surface is preferably defined by either an ellipse or a parabola that is rotated about an axis of revolution, for any angular distance between zero and one complete revolution. The shape of this reflector surface can also be preferably defined by the coincident surfaces of revolution of an ellipse and a parabola that are rotated about a common axis of revolution.

16 Claims, 7 Drawing Sheets

Ellipse-Generated Reflector

SYNCHRONIZED MULTIPLE TRANSDUCER SYSTEM

FIELD OF THE INVENTION

This invention relates to transducers, and specifically to an improved means for combining the output of the transducers used in multiple transducer extended frequency bandwidth devices by utilizing a reflective component to reflect, redirect and focus acoustic or electromagnetic radiation. The invention also relates a means for locating each transducer in a position which will cause the radiated energy from each to reach the same selected point in phase or in time synchronization.

BACKGROUND OF THE INVENTION

Heretofore, acoustic and other transducers (including loudspeakers, compression drivers, light sources, and sources of electromagnetic radiation such as antennas or klystron devices) have made use of a myriad of methods to convert electric signals from one form to another, or in the case of acoustic transducers, to convert electric signals to acoustic signals. For example, the vast majority of acoustic transducers operate by electromagnetically coupling an electric signal to a diaphragm in order to create the acoustic signal. A primary deficiency of these acoustic transducers is their frequency dependent beamwidth. In general, the beamwidth of many state-of-the-art acoustic and electromagnetic transducers is dependent on the frequency of vibration and the size of the vibrating element.

Because of the interdependence of transducer size, frequency, and beamwidth typical acoustic transducer systems (such as a loudspeaker) utilize a multiple transducer arrangement to produce an acceptable beamwidth throughout the frequency range of human hearing. In the case of electromagnetic transducers, a uniform controlled beamwidth and the elimination of interference between multiple transducers is crucial to improved signal reception and reproduction. A primary deficiency in this use of multiple transducers is that the physical size of a transducing element places a constraint on how closely together in spatial alignment multiple transducers can be located with respect to one another. This constraint results in interference between the radiated energy fields of different transducers at frequencies where the transducers overlap, which in the case of an acoustic transducing system causes a degradation in overall sound quality that is detectable by the human ear.

This interference is due to the unequal pathlengths traveled by radiated energy waves that emanate from two different sources but which come together at the same point. Therefore in the case of acoustic transducers, it is crucial to sound quality to spatially locate multiple transducers as closely together as possible. In an attempt to accomplish this, several loudspeaker systems utilize a coaxial arrangement in which a high frequency transducer (tweeter) is nested within a low frequency transducer (woofer). This aligns the sound sources in as close a spatial relationship as possible given the physical size of each transducer. However, this arrangement is still subject to interference at high frequencies, since the radiation pathlengths traveled from the woofer and tweeter to a given sampling point are still unequal. An alternative is to locate the transducers in positions which will cause the radiated energy from each to reach the same designated point substantially in phase or in time synchronization within the frequency region in which each transducer simultaneously operates. This will minimize the interference between transducers and create an overall sound pattern that mimics the actual sound source as closely as possible.

Recently a transducing system has become available (U.S. Pat. No. 4,421,200) which controls beamwidth dependence by using a reflective component shaped as a section of elliptical cross sections that have radially oriented distinct focal points and share a common focal point. Transducers placed at the distinct focal points have their acoustic or electromagnetic radiation redirected to the common focal point. By selecting the parameters of the ellipses and their orientation with respect to one another, the redirected energy, appearing to emanate from the common focal point, can be made to have a nearly constant beamwidth, irrespective of the frequency dependent beamwidth of the transducers placed at the distinct focal points. The beamwidth of the redirected energy in this novel transducing system is fixed by the parameters of the ellipses shaping the reflective component, and thus is not variable. Moreover, it may not be possible to reflect all the radiation emitted from the transducers, resulting in interference between the reflected and non-reflected radiation.

Another new transducing system (U.S. Pat. No. 4,629,030) utilizes a reflective component with a surface defined by an ellipse that is rotated about an axis of revolution which lies in the plane of the ellipse, and which is oriented at any finite angle with respect to the major axis of the ellipse. This axis of revolution contains the focal points that are common to the ellipse as it is rotated. This reflective component is characterized by a common focal point as well as a focal curve. By placing a transducer at the common focal point, electromagnetic or acoustic radiation is redirected by the reflective component and focused on the focal curve, causing the focal curve to appear as the source of the radiation. Conversely, electromagnetic or acoustic radiation emitted from a transducer placed at the focal curve will be focused on the common focal point. In that case, the common focal point appears to be the source of the radiation. This transducing system also has a fixed beamwidth determined by the parameters of the ellipse shaping the reflective component. It is also possible for the redirected energy to be degraded by interference with electromagnetic or acoustic radiation which emanates from the transducer but does not strike the reflective component.

Yet another new transducing system (U.S. Pat. No. 4,836,328) utilizes a reflective component with a surface defined by a parabola that is rotated about an axis of revolution that lies in the plane of the parabola and is oriented parallel to the major axis of the parabola. The reflective component is characterized by a focal curve. Electromagnetic or acoustic radiation emanating from a transducer placed perpendicular to both axes will be redirected by the reflective component and focused on the focal curve, causing the focal curve to appear as the source of the radiation. Conversely, electromagnetic or acoustic radiation from a transducer placed at the focal curve will be redirected as if emanating from a plane wave. This transducing system is also has a fixed beamwidth determined by the parameters of the parabola shaping the reflective component, and it is possible that the redirected energy may be degraded by interference with electromagnetic or acoustic radiation which emanates from the transducer but does not strike the reflective component.

The invention described herein provides for a method to improve the above described transducing systems for use in multiple transducer extended frequency bandwidth devices, by locating multiple transducers in positions which will result in the radiated energy from each to reach the same sampling point substantially in phase or in time synchronization within the frequency region at which each transducer simultaneously operates. Alternatively, one embodiment of the invention provides a means for locating multiple transducers in positions which will cause the radiated energy from each to reach the same designated point substantially in phase or in time synchronization, within the frequency region at which each transducer simultaneously operates. Also a positioner is used to focus and redirect the output of multiple transducers into a more localized area, thereby minimizing the interference normally created by the use of multiple transducers. This latter embodiment utilizes a novel reflective component which has a surface defined by the coincident surfaces of revolution of an ellipse and a parabola and characterized by two distinct focal curves (which may be coincident) and a single focal point common to the elliptical surface. Multiple reflecting transducers placed in positions as described below will have their radiation appearing to emanate from these focal curves. The virtual sources of the radiation are the focal curves, which are substantially closer in spatial alignment than the transducers themselves, largely eliminating the interference that would be experienced if two separate, constant beamwidth transducers were used without the reflective shell. The overall output of this arrangement minimizes the interference between the multiple transducers at overlapping frequencies while at the same time maintaining the substantially frequency invariant beamwidths known to be gained by the use of such reflective surfaces.

The overall output of any of the invention minimizes the interference between the multiple transducers at overlapping frequencies, while at the same time maintaining the substantially frequency invariant beamwidths known to be gained by the use of such reflective surfaces. The present invention also provides an improved multiple transducing system by providing a means for varying the beamwidth of the redirected acoustic or electromagnetic energy without altering the parameters of the reflective component, and by providing a means to attenuate or eliminate the energy which emanates from a transducer but does not strike the reflective component.

Accordingly, it is an object of this invention to provide a device which will minimize interference from multiple transducers that utilizes a reflective component to reflect, redirect and focus acoustic or electromagnetic radiation, and that has transducer locations which will cause the radiated energy from each transducer to reach a selected point substantially in phase or in time synchronization within the frequency region at which each transducer simultaneously operates, while at the same time maintaining the substantially frequency invariant beamwidths generated by use of such reflective components.

It is a further object of this invention to provide a device which will minimize interference from multiple transducers that utilizes a reflective component to reflect, redirect and focus acoustic or electromagnetic radiation, combined with an acoustic or electromagnetic absorbing element which will attenuate or eliminate that radiation emanating from a transducer which would not otherwise strike or impinge upon the reflective component.

It is another object of this invention to provide a device which will minimize interference from multiple transducers, by utilizing a reflective component that focuses acoustic or electromagnetic radiation emitted from the transducers such that the radiation appears to be emanated from focal curves which are in closer proximity to one another than the transducers themselves.

SUMMARY OF THE INVENTION

In general, the present invention comprises a device capable of emitting either acoustic or electromagnetic radiant energy. The device has at least one reflector with a smooth concave surface which reflects the energy emitted from the transducing element. The device also has at least two transducing elements for producing this energy. The shape of this reflector surface is preferably defined by either an ellipse or a parabola that is rotated about an axis of revolution, for any angular distance between zero and one complete revolution. The shape of this reflector surface can also be preferably defined by the coincident surfaces of revolution of an ellipse and a parabola that are rotated about a common axis of revolution.

In the case of the ellipse, the axis of revolution lies in the plane of the ellipse, is oriented at any angle greater than zero with respect to the major axis of the ellipse, and intersects the major axis of the ellipse at the focal point that is common to the continuum of ellipses defined by the rotation. In the case of the parabola, the axis of revolution lies in the plane of the parabola, and is parallel to the major axis of the parabola.

The "para-elliptic" reflector surface is formed by rotating coincidentally, between zero and one complete revolution, a section of both geometric shapes about a common axis of revolution that lies in the plane of both geometric shapes. In each case, the resulting reflector surface will be characterized by at least one set of distinct focal points defining a focal curve.

The elliptical focal curve contains the unique focal point of each single ellipse in the continuum defined by rotating the ellipse about the axis of revolution. The parabolic focal curve contains the unique focal point of each single parabola in the continuum defined by rotating the parabola about the common axis of revolution. The para-elliptic reflector surface will be characterized by both an elliptical and a parabolic focal curve.

An elliptical reflecting transducing element may be positioned above the reflector surface to produce energy that will be redirected by the reflector surface into an elliptical focal region containing the elliptical focal curve. Likewise, a parabolic reflecting transducing element may be positioned above the reflector surface to produce energy that will be reflected by the reflector surface into a parabolic focal region containing the parabolic focal curve. Focused energy will be redirected as if emanating from each focal region, causing each focal region to appear as a virtual source of the energy. The radiation pattern, or beamwidth, of this energy will be substantially frequency invariant. However, the beamwidth for either transducer can be adjusted by moving that transducer to another location.

Either or both reflecting transducing elements are combined with a non-reflecting transducing element such that the energy from the non-reflecting transducing element reaches each focal region substantially in phase or in time synchronization with the energy from the corresponding reflecting transducing element, within the frequency region at which each transducer simultaneously operates. In the case of the para-elliptic reflecting surface, the virtual sources of the radiation are both the elliptical focal curve and the parabolic focal curve, sources which are substantially closer in spatial relationship than the transducers themselves. The radiation pattern, or beamwidth, of the redirected energy will be substantially frequency invariant for any surface used. However, the beamwidth of all transducers can be adjusted by the use of a means of moving and fixing that transducer at another location. In addition, a means is provided for absorbing or attenuating that radiation which would not strike and be reflected from the reflector surface, in order to eliminate interference between the reflected and non-reflected radiation. Other advantages of the invention will become apparent from a perusal of the following detailed description of presently preferred embodiments taken in connection with the accompanying drawings.

BRIEF DESCRIPTION OF THE DRAWINGS

FIG. (1) is an orthogonal view of an ellipse rotated to define an elliptical surface of revolution.

FIG. (2) is an orthogonal view of a parabola rotated to define a parabolic surface of revolution.

Figure 1:
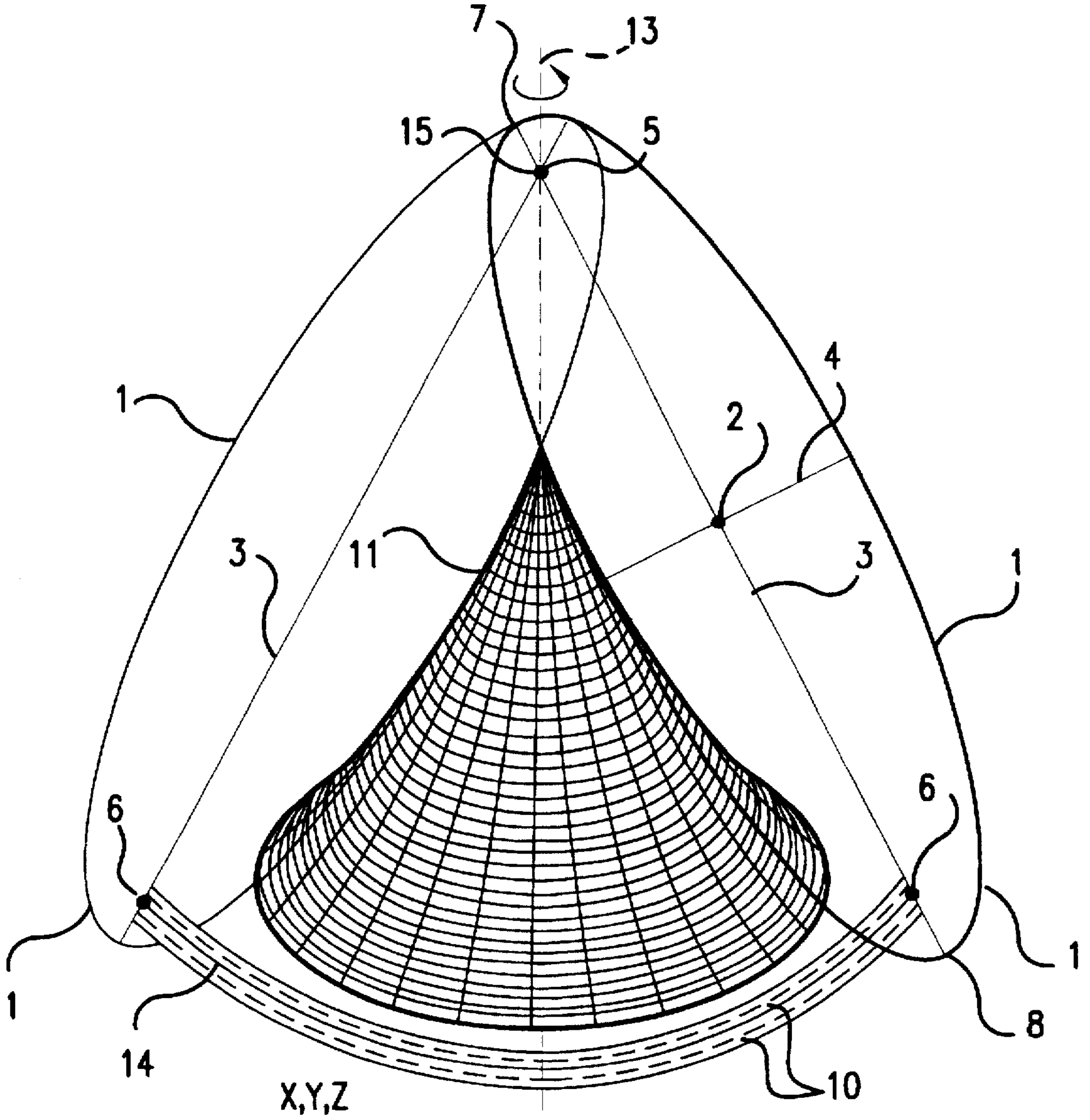
Figure 2:
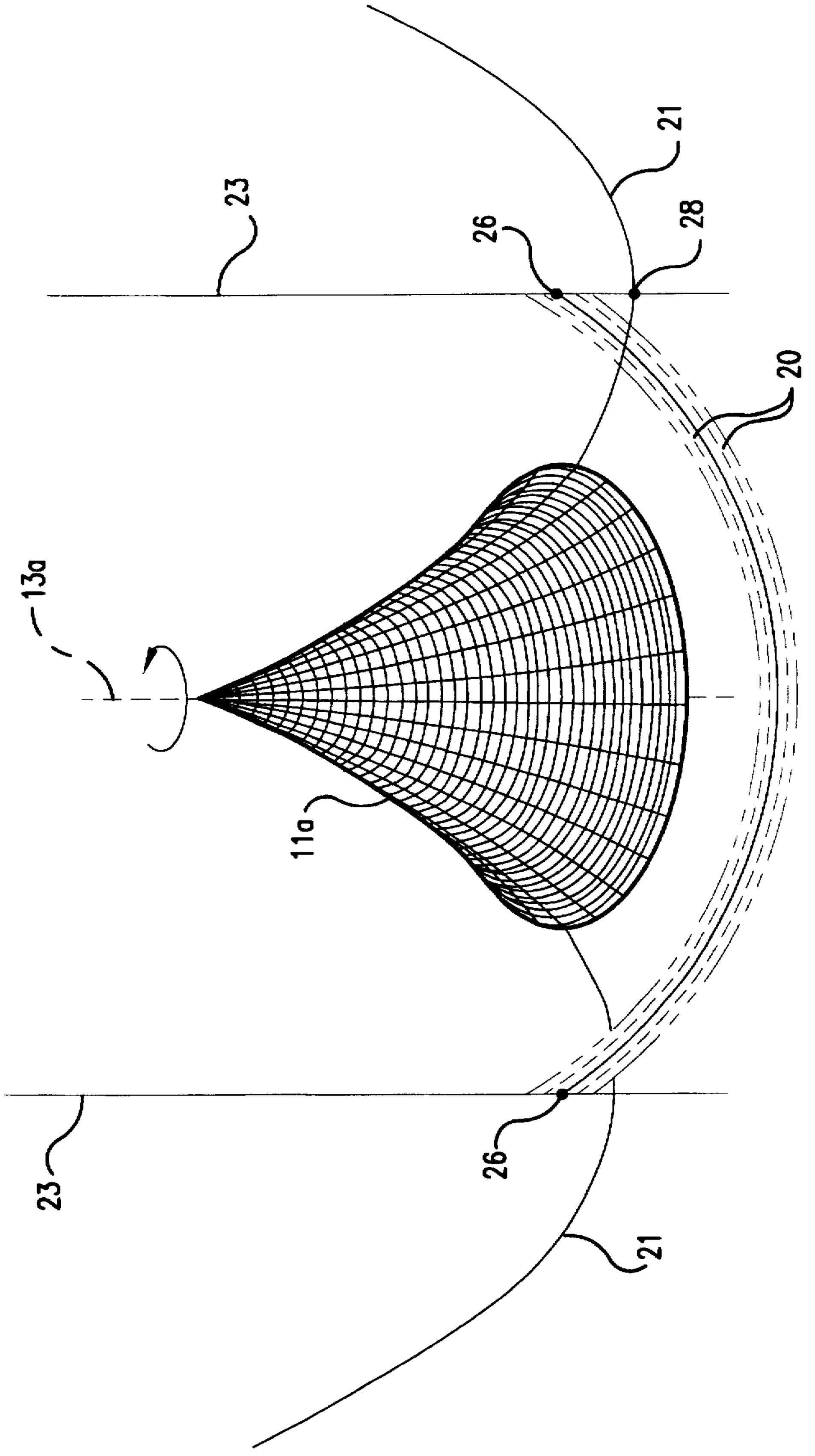
Figure 3:
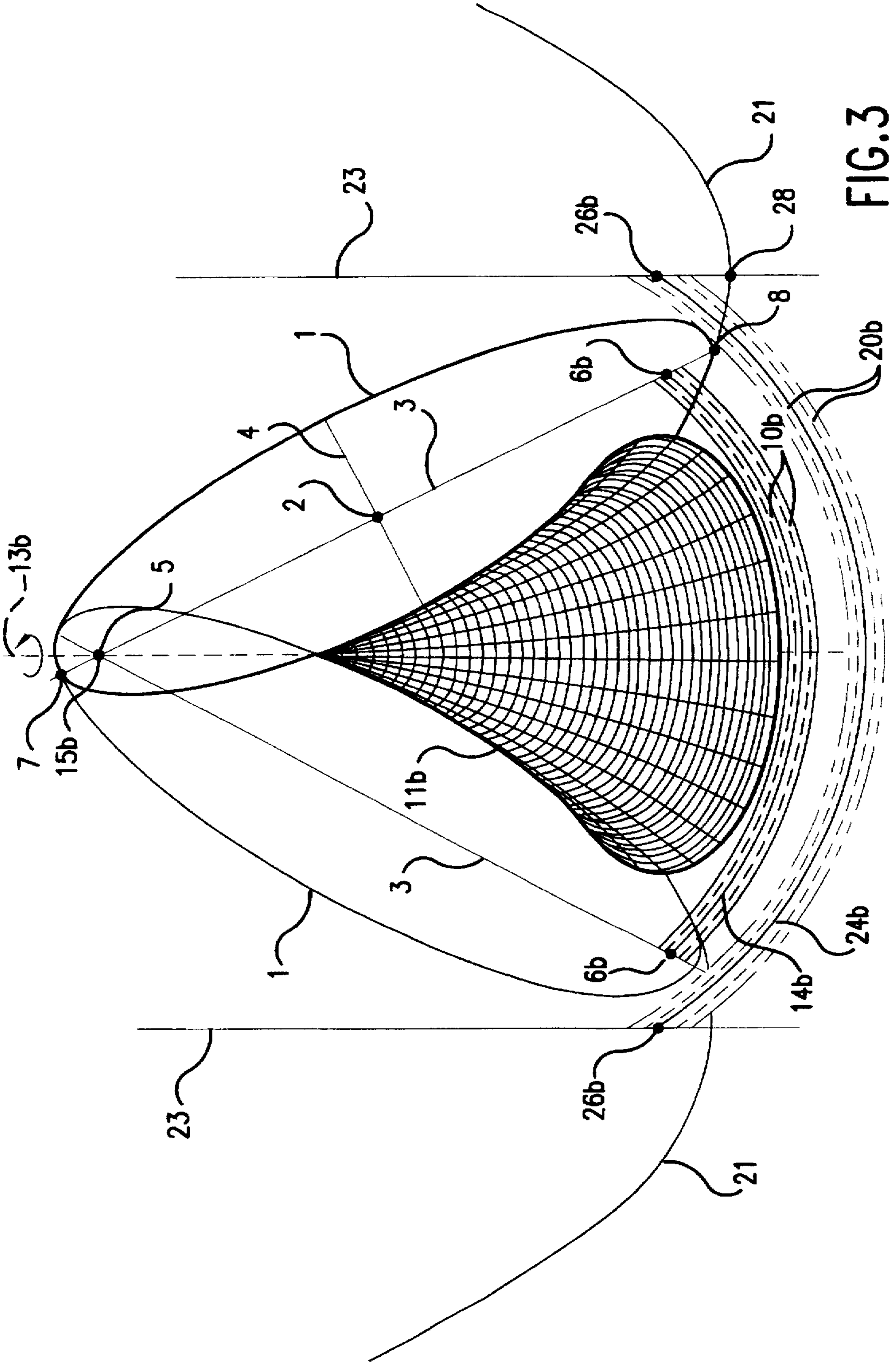
Figure 4:
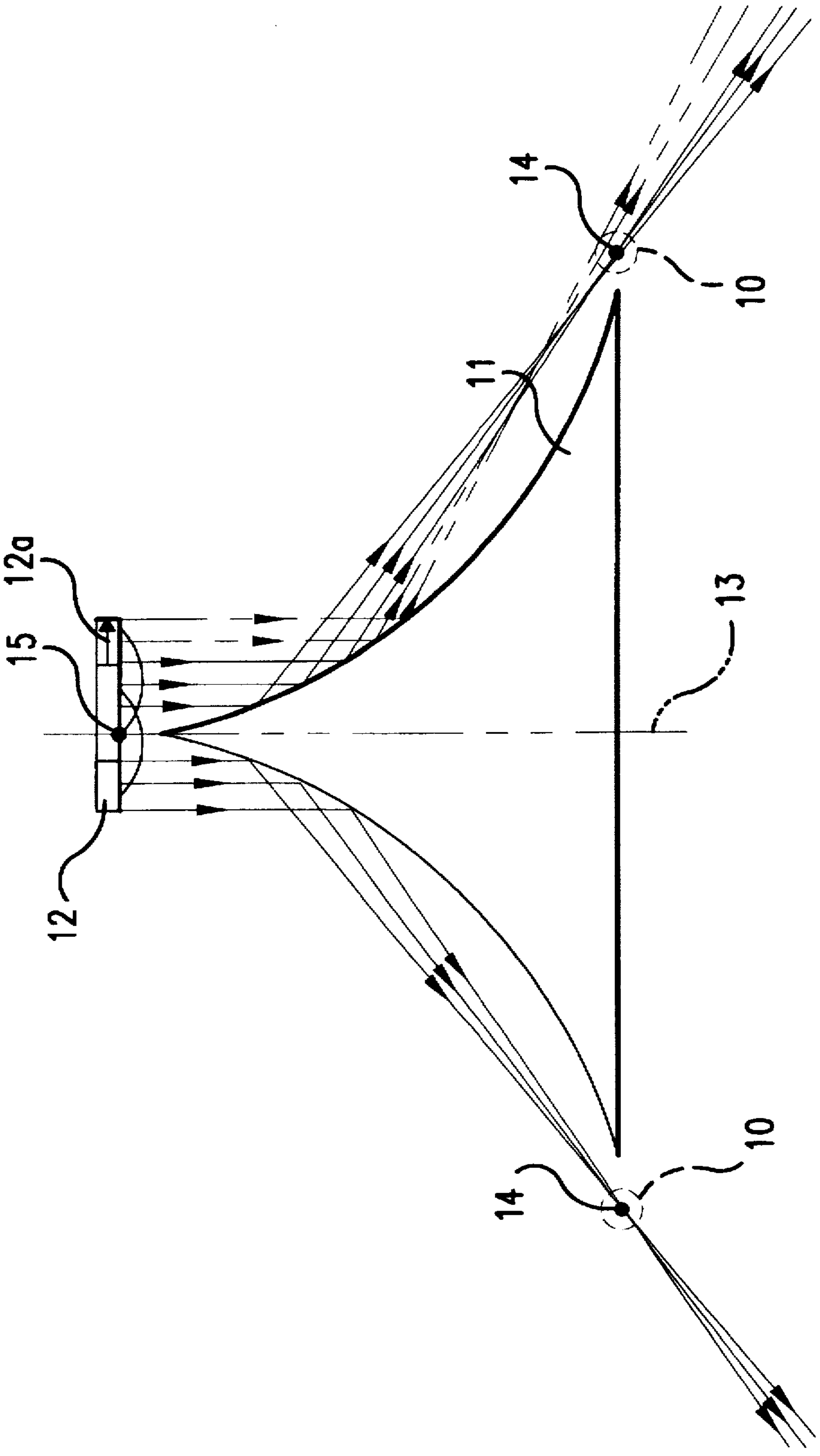
Figure 5:
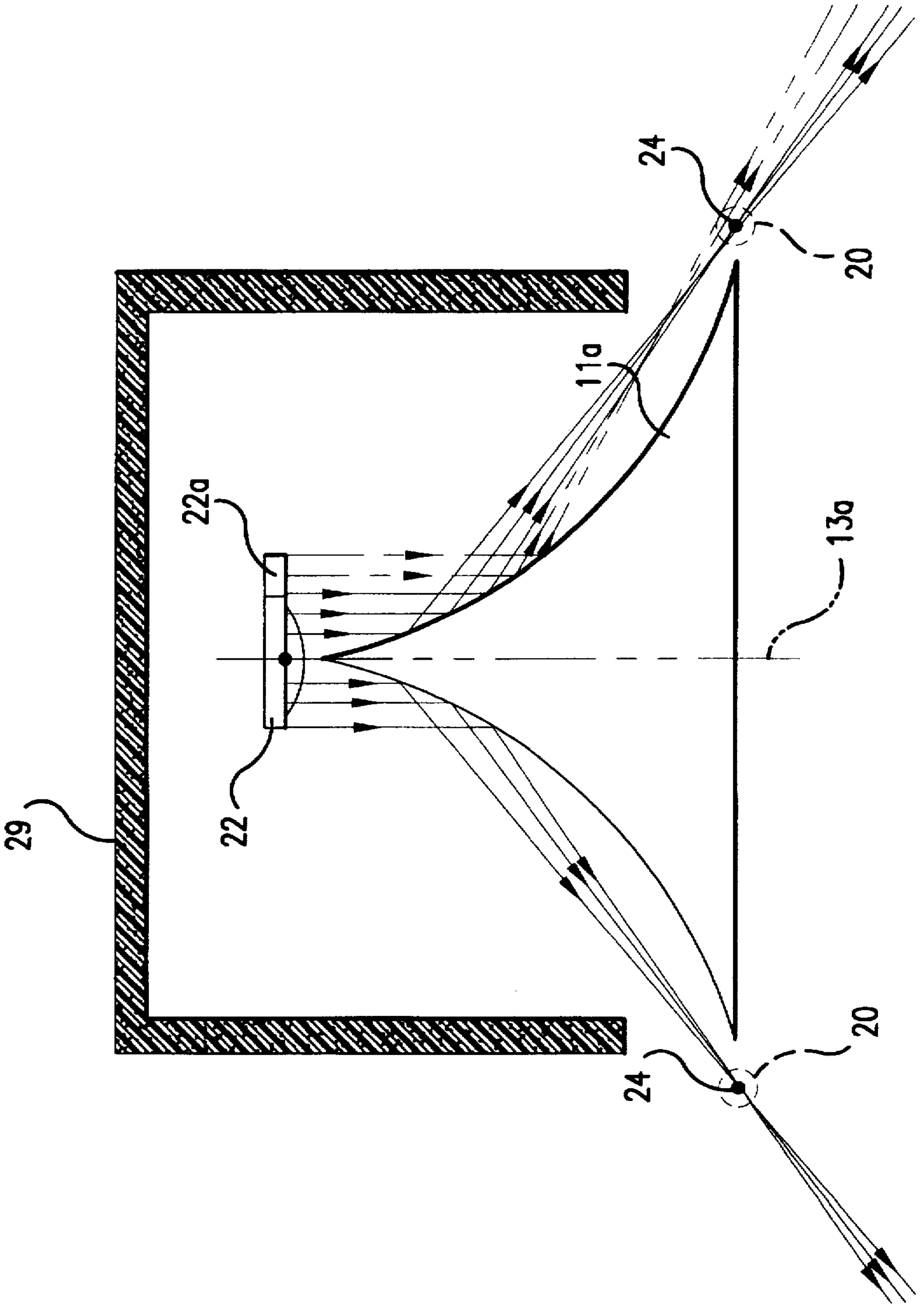
Figure 6:
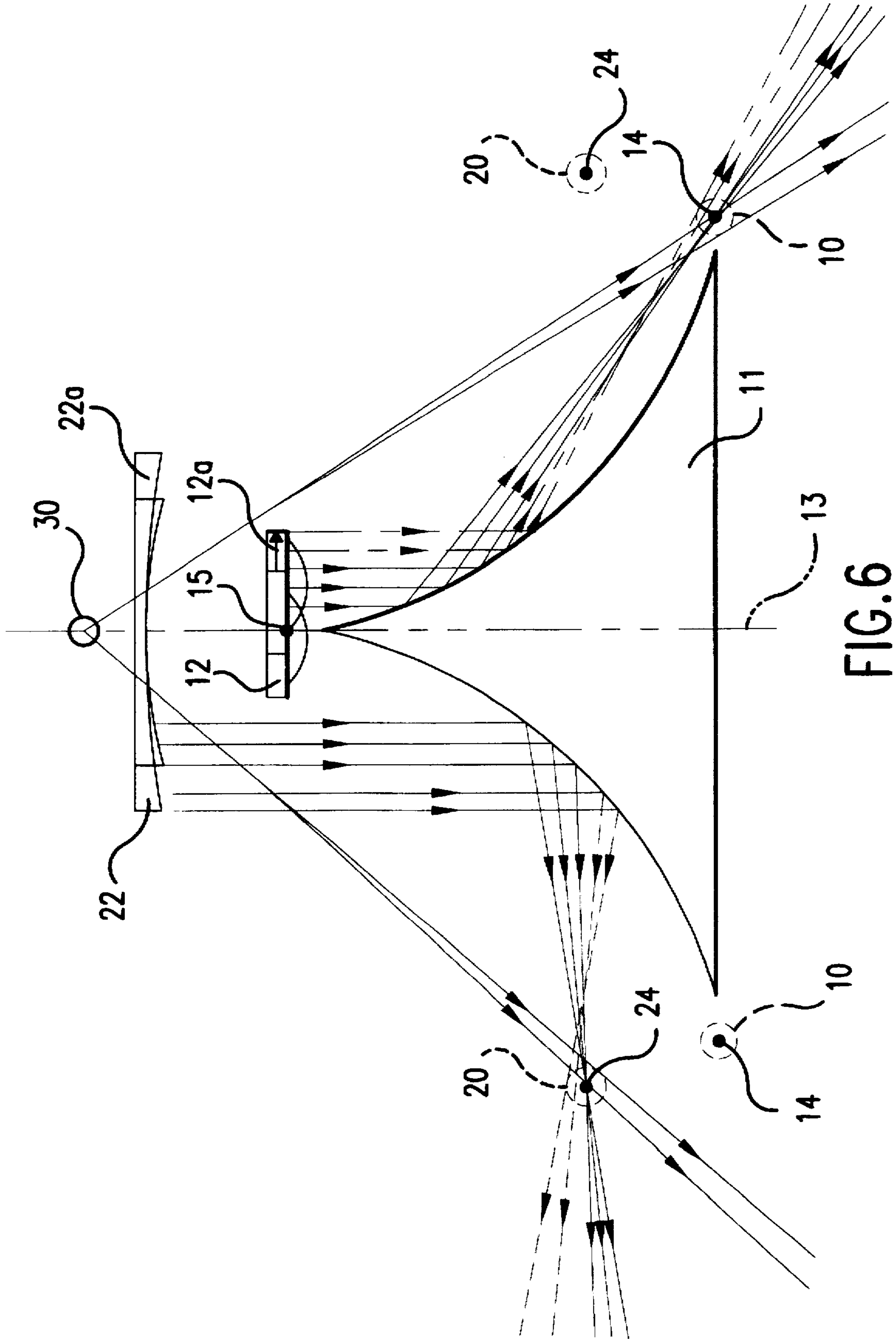
Figure 7:
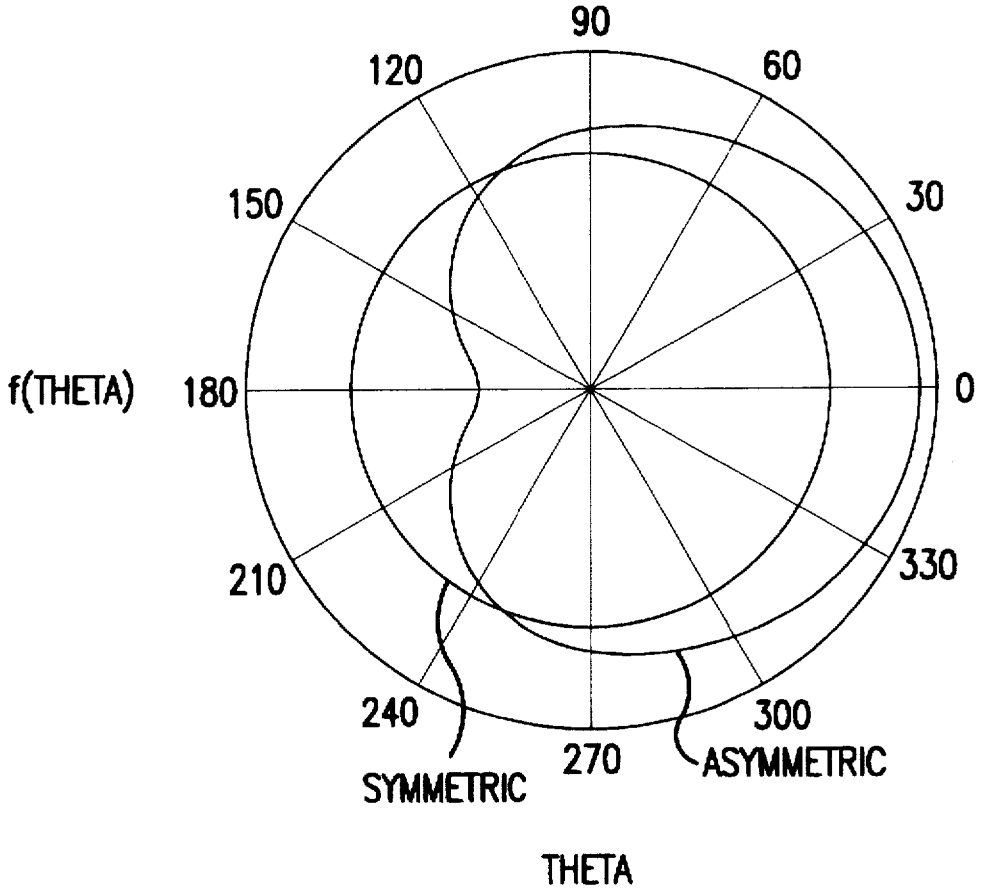

FIG. (3) is an orthogonal view of the para-elliptic reflective component as defined herein, showing the parabolic and elliptical sections used to generate the curvature of the side of this component.

FIG. (4) is an orthogonal view one embodiment of the invention, utilizing a reflector and a movable transducing element.

FIG. (5) is a sectional elevation view of another embodiment of the invention, utilizing a reflector, a movable transducing element, and a radiation attenuation means.

FIG. (6) is a sectional elevation view of the embodiment of the invention showing a non-reflecting transducing element combined with two reflecting transducing elements.

FIG. (7) is a polar plot of the radiation intensity around the axis of rotational symmetry of the reflector, illustrating the change in the beamwidth of the transducer system as a transducer is moved from a symmetric position about the axis of revolution in a plane perpendicular to this axis.

DETAILED DESCRIPTION OF THE PREFERRED EMBODIMENTS

As used herein, the reflector surface is an acoustic or electromagnetic reflective shell, with a surface made of acoustically reflective materials known in the art, such as wood, metal, concrete, or plastic; or with a surface made of materials known to be capable of reflecting electromagnetic energy, such as metal, an electrically conducting metal-fiberglass composite, dielectrics, or mirrors in the case of visible light. The shape of the reflector surface can be defined by either an ellipse or a parabola that is rotated about an axis of revolution. The shape of the reflector surface can also be defined by the coincident surfaces of revolution of an ellipse and a parabola that are rotated about a common axis of revolution. In the latter case, the "para-elliptic" reflector surface described herein is at least a section of an acoustic or electromagnetic reflective shell defined by a "para-elliptic curve" that simultaneously satisfies the description of both the parabolic and elliptical surfaces of revolution given below, and as such is characterized by a common elliptical focal point and two distinct focal curves (which may be coincident), one elliptical and one parabolic.

Referring to FIG. (1), the ellipse 1 includes two axes 3 and 4 that are perpendicular to one another and that intersect at the center 2 of the ellipse. The major axis 3 is the longer of the two axes, and it contains the two focal points 5 and 6 of the ellipse. The focal points 5 and 6 are located along the major axis 3 at points equidistant from the two vertices 7 and 8, which are both bisected by the major axis 3. The curvature of the surface of the ellipse 1 is such that any wavefront originating at focal point 5 or 6 that is reflected from the elliptical surface will pass through the opposite focal point 6 or 5.

As shown in FIG. (1), the surface of the reflector 11 can be defined by a revolved ellipse 1. The ellipse 1 is rotated about an axis of revolution 13 that lies in the plane of the ellipse 1. The axis of revolution 13 can be oriented at any angle greater than zero with respect to the ellipse major axis 3, and it intersects the ellipse major axis 3 at a point 15 that substantially coincides with the focal point 5 that remains common to the continuum of ellipses generated by rotation of the ellipse 1. As a section of the ellipse 1 is rotated about the axis of revolution 13 for any angular distance between zero and one complete revolution, it defines the elliptical reflector surface 11. This reflector surface 11 is characterized by a common focal point 15 lying above the reflector surface 11, and a set of distinct focal points defining an elliptical focal curve 14. Each distinct focal point in the elliptical focal curve 14 is the unique focal point 6 of each single ellipse in the continuum of ellipses forming the reflector surface 11.

Also applicable to this invention is a reflector surface **11*a* shaped by a revolved parabola 21. The parabola 21, shown in FIG. (2), is a curved geometric figure defined by a major axis 23 that bisects a single vertex 28. The parabola 21 is further defined by a single focal point 26, which is located along the parabola major axis 23 such that any wavefront reflected from the surface of the parabola 21 will pass through the focal point 26. To form the parabolic reflector surface 11*a*, the parabola 21 is rotated about an axis of revolution 13*a*, which lies in the plane of the parabola 21, and is oriented substantially parallel to the parabola major axis 23. As a section of the parabola 21 is rotated about the axis of revolution 13*a* for any angular distance between zero and one complete revolution, it defines the shape of the parabolic reflector surface 11*a*. This reflector surface 11 is characterized by a set of distinct focal points defining a parabolic focal curve 24. Each distinct focal point in the parabolic focal curve 24 is the unique focal point 26 of each single parabola in the continuum of parabolas forming the reflector surface 11*a***.

To form the "para-elliptic" reflector surface **11*b*, as shown in FIG. (3), a section of the ellipse 1 is rotated about a common axis of revolution 13*b* coincident with a section of the parabola 21. As the ellipse 1 is rotated about the common axis of revolution 13*b* for any angular distance between zero and one complete revolution, it defines the elliptical component to the shape of the "para-elliptic" reflector surface 11*b*. This reflector surface 11*b* is characterized by a common focal point 15*b* lying above the reflector surface 11*b*, and a set of distinct focal points defining an elliptical focal curve 14*b*. Each distinct focal point in the elliptical focal curve 14*b* is the unique focal point 6*b* of each single ellipse in the continuum of ellipses forming the "para-elliptic" reflector surface 11*b***.

Coincident with the rotation of the ellipse 1 about the common axis of revolution **13*b*, a parabola 21 is rotated up to one complete revolution about the common axis of revolution 13*b*, to define the parabolic component to the shape of the "para-elliptic" reflector surface 11*b*. The common axis of revolution 13*b* lies in the plane of the parabola 21, and is oriented substantially parallel to the parabola major axis 23. The reflector surface 11*b* is thus also characterized by a set of distinct focal points defining a parabolic focal curve 24*b*. Each distinct focal point in the parabolic focal curve 24*b* is the unique focal point 26*b* of each single parabola in the continuum of parabolas forming the "para-elliptic" reflector surface 11*b***.

Ideally as shown in FIG. (4), energy produced by an elliptical transducing element 12 symmetrically positioned about axis of revolution 13 will be reflected entirely on the focal curve 14. In the case of the ellipse, the energy will be focused entirely onto the elliptical focal curve 14 if the elliptical transducing element 12 is positioned such that the "virtual source" of its produced energy coincides with the common focal point 15. The "virtual source" is characterized as that point from which all the energy produced by the elliptical transducing element 12 would emanate, if the elliptical transducing element 12 were replaced by a single point. As also shown in FIG. (4), an elliptical transducing element 12*a*, not positioned symmetrically about the axis of revolution 13, will produce energy that is reflected by the reflector surface 11 and focused into an elliptical focal region 10 containing the elliptical focal curve 14. The focused energy will be redirected as if emanating from the elliptical focal region 10, causing the elliptical focal region 10 to appear as the source of the energy.

The focal regions are areas having an increased concentration of acoustic or electromagnetic radiant energy. The level of energy concentration within the focal regions will vary relative to the positioning of the transducing element with respect to the reflector axis of revolution. Ideally, the energy produced by the transducing element will be reflected by the reflector surface entirely on the focal curve. In one embodiment, this invention takes advantage of these characteristic focal regions by varying the positioning of the transducing element relative to the reflector axis of revolution to control and vary the beamwidth shape of the redirected energy that is reflected through the focal region 10 or 20. It is well known in the state of the art that transducing systems utilizing a reflective component will function properly despite a lack of perfect precision in the positioning of the transducing element relative to the reflective surface. This lack of precision may be created by machining tolerances in the reflective surface, or by an inexact mounting of the transducing element relative to the reflective component.

As shown in FIG. (4), when a lack of perfect precision prevents the elliptical transducing element 12*a* from being positioned in an exactly symmetric manner about the reflector axis of revolution 13, its energy will not be focused entirely on the elliptical focal curve 14, but will be substantially focused into an elliptical focal region 10 surrounding the elliptical focal curve 14. The principal limitation placed on the positioning of the elliptical transducing element 12 with respect to the reflector axis of revolution 13 is that the energy produced by the elliptical transducing element 12 that strikes the reflector surface 11 must be substantially focused into the elliptical focal region 10. In the elliptical embodiment, the redirected energy will be substantially focused into the elliptical focal region 10 if the elliptical transducing element 12*a* is positioned such that the "virtual source" of the produced energy is approximately, but not perfectly, coincident with the common focal point 15.

Referring to FIG. (5), radiant energy produced by a parabolic transducing element 22 positioned symmetrically about the axis of revolution 13*a*, that travels a path substantially parallel to the axis of revolution 13*a*, will be reflected by the reflector surface 11*a* entirely on the parabolic focal curve 24. Radiant energy produced by a transducing element 22*a* positioned anywhere above the reflector surface 11*a*, that travels a path substantially parallel to the axis of revolution 13*a*, will be substantially focused by the reflector surface 11*a* into a parabolic focal region 20 surrounding the parabolic focal curve 24. The focused energy will be redirected as if emanating from the parabolic focal region 20, causing the parabolic focal region 20 to appear as the source of the energy.

The transducers described herein may act as an acoustic transducer which acts to convert an electrical signal to an acoustical signal by any methods known in the state of the art, as in the case of a loudspeaker, or an electromagnetic transducer which acts to convert an electric signal to an electromagnetic signal by any methods known in the state of the art, as in the case of an antenna or light source. As a result of the inherent dual nature of some mechanical or piezoelectric transducing means known in the state of the art in reversibly converting acoustic or electromagnetic radiation into electrical current (such as a microphone or an antenna, respectively), the transducer described herein may also act as a receiver of acoustic or electromagnetic radiation. Other transducing means in the state of the art that will only convert electrical current into acoustic energy (such as plasma or glow discharge loudspeaker) or that will only convert electrical current into electromagnetic radiation (such as a laser, light-emitting diode, glow discharge tube or a lightbulb) will work with the concepts disclosed and are thus covered the use of the term transducer as described herein.

As shown in FIG. (6), this invention provides a method for locating a non-reflecting transducing element 30 in combination with one or both reflecting transducing elements 12 and/or 22. Each reflecting transducing element 12 and/or 22 is in a position which will cause its energy to be reflected from the reflector 11, and redirected into its respective focal region 10 and/or 20, as described above for the reflective shape desired. Combined with the reflecting transducing element 12 and/or 22 is a non-reflecting transducing element 30, which can be positioned at any location within the device such that its energy reaches the elliptical focal region 10 substantially in phase or in time synchronization with the energy from the reflecting elliptical transducing element 12, within the frequency region at which they simultaneously operate. The non-reflecting transducing element 30, can also be positioned at any location within the device such that its energy reaches the parabolic focal region 20 substantially in phase or in time synchronization with the energy from the reflecting parabolic transducing element 22, within the frequency region at which they simultaneously operate. With any shape of the reflector surface 11 described above, this arrangement will minimize the interference normally created by the use of multiple transducers, due to the in-phase relationship of the combined radiated energy, thus improving overall transducer performance.

The embodiment of the invention showing a means of moving and fixing a transducer at various positions relative to the axis of revolution 13 is shown in FIG. (4). The transducing element 12 is initially ideally positioned symmetrically about the axis of revolution 13 of the reflector surface 11. Acoustic or electromagnetic radiation emitted from the transducing element 12 is directed substantially toward the reflector surface 11, is reflected therefrom, and is focused on the focal curve 14. The transducing element 12*a* may be moved to another location asymmetric with the axis of revolution 13. This movement can be accomplished by any means in the state of the art, including mechanically actuated means such as screws or sliding pins, or electrically actuated means such as a servomotor or a piezoelectric motor. The transducing element 12*a* may be fixed at the new location by any means in the state of the art, including mechanically actuated means such as screw locks, or frictional clamps, or electrically actuated means such as a servomotor or a solenoid. In its initial position symmetric about the axis of revolution 13, radiation emitted from the transducing element 12 is initially redirected uniformly from the reflector surface 11, with approximately equal intensity and an approximately 360 degree radiation pattern (beamwidth) from any point on the focal curve 14. As the transducing element 12*a* is moved to a position asymmetric with respect to the axis of revolution 13, the emitted acoustic or electromagnetic radiation will be redirected non-uniformly from the reflector surface 11, with variable intensity and beamwidth from the points within the focal region 10 surrounding and containing the focal curve 14. The means of moving and fixing transducing elements described above can be used with all surfaces and with all transducing elements described.

FIG. (7) illustrates the change in intensity of the emitted acoustic or electromagnetic radiation, as an acoustic transducing element is moved as described above. As can be seen, the intensity varies such that the beamwidth of the acoustic signal is narrowed as the transducing element is moved as described above. It is important to note that the beamwidth is controlled by the relative position of the transducing element in relation to the axis of revolution of the reflector surface. The beamwidth of the radiation has been rendered substantially independent of frequency changes by the attributes of the reflector surface as shown in the state of the art, and thus for any fixed location of the transducing element above the reflector surface, the beamwidth will remain constant as the frequency of the radiation is varied. Further, in the case of multiple transducer embodiments the virtual sources of the radiation are the elliptical focal region and the parabolic focal region, sources which are substantially closer in spatial relationship than the transducers, largely eliminating the interference that would be experienced if multiple constant beamwidth transducers were used without the reflective shell.

The embodiment of a means of moving and fixing the transducer at various positions relative to the axis of revolution, combined with a means of attenuating or eliminating that radiation which would not strike the reflective component, is shown in FIG. (5). In the operation of this embodiment, the transducing element 22 is initially ideally positioned symmetrically about the axis of revolution 13*a* of the reflector surface 11*a*. Acoustic or electromagnetic radiation emitted from the transducing element 22 is directed substantially toward the reflector surface 11*a*, is reflected therefrom, and is focused on the focal curve 24. Acoustic or electromagnetic radiation which would not strike and be reflected from reflector surface 11*a* is absorbed by absorbing element 29. Depending on the nature of the transducing system utilized, the absorbing element 29 may be constructed of a material capable of absorbing or attenuating acoustic energy, such as fiberglass or foam, or of a material capable of absorbing or attenuating electromagnetic radiation, such as carbon-plastic or metallic-plastic composites, or flat black paint in the case of visible light. As is obvious but not shown, the absorbing element 29 may be extended in a direction parallel to the axis of revolution 13*a*, toward or away from reflector surface 11*a*, so as to vary the amount acoustic or electromagnetic radiation absorbed or attenuated.

While presently preferred embodiments have been shown and described in particularity, the invention may be otherwise embodied within the scope of the appended claims.

What is claimed is:

1. An apparatus for transducing acoustic or electromagnetic radiant energy, which comprises:

A. at least one reflector with a smooth concave surface in the plane of a conic section of said reflector for reflecting energy into at least two focal regions of said surface; and B. at least three transducing elements for producing said energy, comprising:

(i) at least one first transducing element positioned such that said energy produced by said first transducing element is substantially reflected from said reflector and is therefrom substantially focused into a first focal region of said surface;

(ii) at least one second transducing element positioned such that said energy produced by said second transducing element is substantially reflected from said reflector and is therefrom substantially focused into a second focal region of said surface; and (iii) at least one third transducing element positioned such that said energy produced by said third transducing element reaches said first focal region substantially in phase or in time synchronization with said energy produced by said first transducing element and positioned such that said energy produced by said third transducing element reaches said second focal region substantially in phase or in time synchronization with said energy produced by said second transducing element for any frequency of said energy at which said transducing elements are simultaneously radiating energy.

2. The apparatus of claim 1, wherein said reflector surface is defined by:

A. rotating about a first axis at least a section of an ellipse having a major axis, said first axis lying in a plane of said ellipse and passing through a first focal point of said ellipse, said first focal point being substantially coincident with a point defined by the intersection of said first axis and said major axis, said first axis being at an angle greater than zero to said major axis, said reflector reflecting said energy into said first focal region having an energy intensity about a first focal arc defined by the rotation of a second focal point of said ellipse about said first axis; and B. rotating about said first axis at least a section of a parabola having a major axis, said first axis lying in a plane of said parabola and being substantially parallel said major axis, said reflector reflecting said energy into said second focal region having an energy intensity about a second focal arc defined by the rotation of the focal point of said parabola about said first axis.

3. The apparatus of claim 1 or 2, further comprising a means for moving said transducing elements to any location relative to said reflector such that said energy is substantially focused into said focal regions and such that said reflected energy will vary in intensity and beamwidth as said transducing elements are moved.

4. The apparatus of claim 3, further comprising a means for fixing said transducing elements at any location relative to said reflector such that said energy is substantially focused into said focal regions.

5. The apparatus of claim 1 or 2, further comprising an element capable of absorbing said energy which surrounds said transducing element to absorb said energy which is not incident upon said reflector.

6. The apparatus of claim 5, wherein said absorbing element is movable such that the amount of said energy absorbed varies with the position of said absorbing element.

7. The apparatus of claim 1 or 2 wherein said transducing elements are positioned symmetrically with respect to said reflector.

8. The apparatus of claim 1 or 2 wherein said transducing elements are positioned asymmetrically with respect to said reflector.

9. The apparatus of claim 1 or 2, further comprising two reflectors which are positioned as mirror images of each other.

10. The apparatus of claim 9, further comprising three pairs of transducing elements which are positioned as mirror images of each other.

11. The apparatus of claim 1 or 2, further comprising one reflector.

12. The apparatus of claim 11, further comprising three transducing element.

13. The apparatus of claim 1 or 2 wherein acoustic sound waves are transduced.

14. The apparatus of claim 1 or 2 wherein electromagnetic radiation is transduced.

15. The apparatus of claim 14, wherein microwave radiation is transduced.

16. The apparatus of claim 2, wherein at least one of the group consisting of:

A. said angle;

B. said major axis;

C. the minor axis of said ellipse; and

D. the focal length of said parabola;

is varied over the surface of said reflector.

* * * * *